(12) United States Patent
Smith et al.

(10) Patent No.: US 7,142,449 B2
(45) Date of Patent: Nov. 28, 2006

(54) LOW TEMPERATURE SILICIDED TIP

(75) Inventors: James D. Smith, Albany, OR (US);
Thomas E. Novet, Corvallis, OR (US);
Alexander Govyadinov, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 98 days.

(21) Appl. No.: 10/759,565

(22) Filed: Jan. 16, 2004

(65) Prior Publication Data
US 2005/0157562 A1   Jul. 21, 2005

(51) Int. Cl.
*G11C 11/14* (2006.01)
(52) U.S. Cl. .................. 365/171; 365/163; 365/34
(58) Field of Classification Search ............... 365/171, 365/163, 34
See application file for complete search history.

(56) References Cited

U.S. PATENT DOCUMENTS

| | | | |
|---|---|---|---|
| 5,446,684 A * | 8/1995 | Kaneko et al. | 365/46 |
| 5,483,741 A | 1/1996 | Akram et al. | |
| 5,504,376 A * | 4/1996 | Sugahara et al. | 257/768 |
| 5,546,375 A * | 8/1996 | Shimada et al. | 369/126 |
| 5,592,736 A | 1/1997 | Akram et al. | |
| 6,414,506 B1 | 7/2002 | Akram et al. | |
| 6,818,921 B1 * | 11/2004 | Yasukawa | 257/59 |

FOREIGN PATENT DOCUMENTS

| | | |
|---|---|---|
| EP | 0792518 | 4/2003 |
| WO | WO96/14660 | 5/1996 |

* cited by examiner

*Primary Examiner*—David Lam

(57) ABSTRACT

A tip, connected to a metal chip component, for forming readable changes in a memory storage system is disclosed. The tip includes a conductive layer, an amorphous silicon layer, and a silicide outer layer. The silicide outer layer contains a metal that has an anneal temperature to form the silicide outer layer at a temperature below that which damages the chip component.

10 Claims, 2 Drawing Sheets

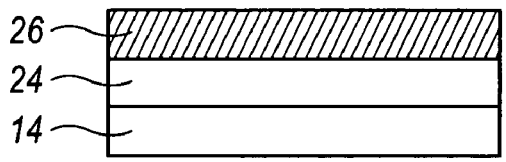
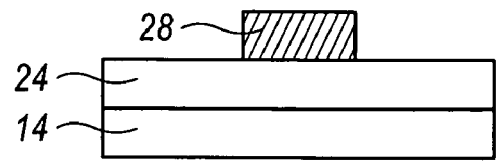
FIG. 3A　　　　　　　　　　FIG. 3B
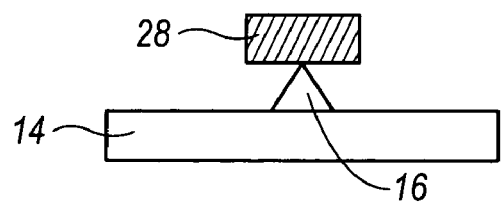
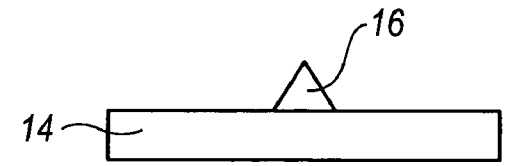
FIG. 3C　　　　　　　　　　FIG. 3D
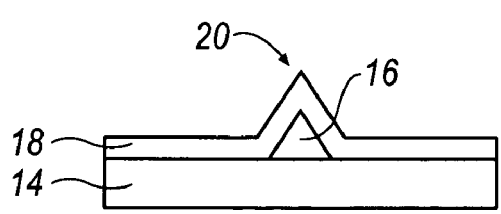
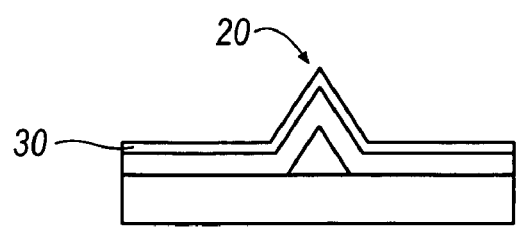
FIG. 3E　　　　　　　　　　FIG. 3F

LOW TEMPERATURE SILICIDED TIP

BACKGROUND

Silicon tips have been proposed for use in memory storage systems. These systems are composed of CMOS or other electrical components, a tip or tip array, a scanning system, and a recording media such as a phase change, plastic, electric charge storage or ferroelectric media. In order to create a bit of stored information, the tip produces an electron flux, heat, contact pressure, and/or applied electric or magnetic field to the particular media to create a physical change. Given the importance of the tip to the storage system, it is desired that the tip have the flexibility to be integrated into standard Integrated Circuit (IC) manufacturing.

Silicon is advantageous for being used as a tip material as there is a large knowledge base on the material's characteristics and it is widely used in the IC industry. Micro and Nano scale devices using silicon can be created using existing processes and equipment. Electronic components of various types, including CMOS, can be integrated by using silicon as a substrate, thereby limiting interconnect length and component size.

There are limitations that make silicon less than ideal for tips in memory devices. Intrinsic silicon has a relatively high resistivity (1K ohm-cm) while standard doped (p or n) silicon has a resistivity of about 0.5–30 ohm-cm. Resistivity limits the amount of current that can be drawn through the tip used as an electron source. For applications involving electromagnetic fields and contact probes, high material resistance means higher applied voltages in order to obtain the proper field or tip temperature. Contact applications involving silicon tips are affected by tip wear, friction, and the tendency of silicon to adsorb contaminates such as water. Finally, the standard method to produce crystalline silicon tips requires process temperatures above the stability zone of electrical components. This higher temperature processing requires that any associated CMOS structures/devices be integrated into the process after the tip formation, thus adding additional complex processing steps and reducing efficient use of die area.

BRIEF DESCRIPTION OF THE DRAWINGS

The present invention will now be described, by way of example, with reference to the accompanying drawings, in which:

FIG. 3A is a schematic view of a first step for forming a low temperature tip according to an embodiment;

FIG. 3B is a schematic view of a step for forming a low temperature tip according to an embodiment;

FIG. 3C is a schematic view of a step for forming a low temperature tip according to an embodiment;

FIG. 3D is a schematic view of a step for forming a low temperature tip according to an embodiment;

FIG. 3E is a schematic view of a step for forming a low temperature tip according to an embodiment; and FIG. 3F is a schematic view of a step for forming a low temperature tip according to an embodiment.

DETAILED DESCRIPTION

The present embodiments provide a tip used for electrical, contact, and magnetic memory applications having a tip sublayer constructed of amorphous silicon which has an outer layer formed of a silicide material. The silicide material, which contains metal, provides the desired low electrical resistance to extract the desired current and, due to the water non-adhesion characteristics of silicide, limits the ability of water to adhere to the surface of the material. The silicide material of the described embodiments contains a metal having a formation temperature that is below a temperature that will cause damage to any CMOS circuitry attached to the tip. As a result, the advantages of low resistance material are obtained without causing harm to any attached memory device.

Figure 1:
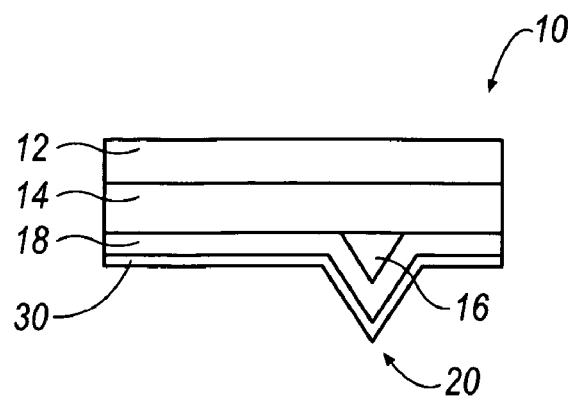
FIG. 1 is a plan side view of a low temperature tip according to an embodiment.

Referring to FIG. 1, a memory storage device 10 is shown having chip component 12 which may be an IC CMOS, bipolar, or any other known memory or electronic component. A conducting or semi-conducting inner layer 14 is disposed on, and electrically connected to the chip component 12 to provide electrical conductivity from the chip component 12 to an external component. The inner layer 14 may be constructed of suitable materials, including silicon and/or other semiconductors and/or conductors, or conducting materials. The electrical connection allows the chip component 12 to effectuate communications through the inner layer 14, such as read and write operations, as will be readily understood by one skilled in the art.

A tip sub-layer 16 is constructed of amorphous silicon which is disposed on inner layer 14. An outer layer 18, formed of a silicide material, is disposed on the tip sub-layer 16 and inner layer 14. The silicide is formed by reacting metal in the outer layer 18 with the amorphous silicon in tip sub-layer 16. In an embodiment of the invention, the outer layer 18 has a depth of approximately 200 Å and is disposed over tip sub-layer 16 and inner layer 14. However, one skilled in the art will readily realize that other depths of outer layer 18 may be used. Additionally, the outer layer 18 does not need to be disposed over the entire inner layer 14 and may be disposed over only tip sub-layer 16. In another embodiment, the outer layer 18 contains platinum or palladium. These and other features will be described in greater detail below.

As discussed above, the outer layer 18 is disposed over the tip sub-layer 16. The outer layer 18 is a silicide layer formed by a reaction between the metal of outer layer 18 and the amorphous silicon of tip sub-layer 16 (as will be discussed in greater detail). The tip sub-layer 16 and the outer layer 18 comprise the tip 20. The remainder of outer layer 18 that covers inner layer 14 can be, but is not necessarily, a silicide layer. Alternatively, the remainder of outer layer 18 may be a layer of the base metal, such as platinum or palladium. Additionally, a nitride layer 30 can be disposed over the outer layer 18 as shown.

Figure 2:
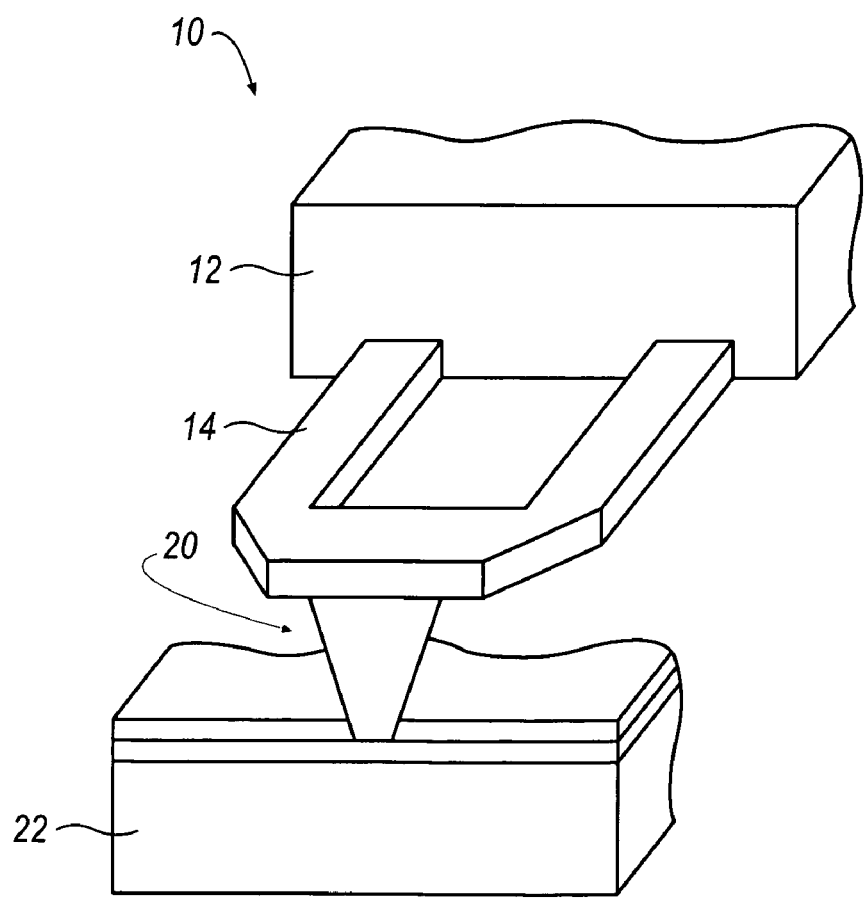
FIG. 2 is a schematic view of a low temperature tip according to an embodiment.

In an embodiment of the invention, as shown in FIG. 2, memory storage device 10 is part of a thermal mechanical storage system. As shown in FIG. 2, inner layer 14 is cantilevered from the chip component 12 and contains tip 20 at an opposite end thereof. Tip 20, inner layer 14 and chip component 12 interact with storage medium 22 to operate as a thermal mechanical or AFM (atomic force microscope) data storage device. Such thermal-mechanical data storage systems use a method of physically indenting a substrate in order to provide a "bit" of information in the write cycle. This is accomplished by utilizing a tip (here, tip 20) on a cantilever type structure (here, inner layer 14), which is heated enough to physically indent the substrate (here, storage medium 22). The read cycle is accomplished by placing the same tip 20, or another tip used only for the read cycle, into the indention to measure some physical or electrical characteristic associated with the tip 20, while the tip 20 is in the indention. For example, the indentation may cause a different current flow from the tip 20. While the present embodiments discusses a thermal mechanical device, the same configuration is extensible to different types of contact probes, such as ferroelectric probes, charge/potential sensitive probes, and magnetic probes.

Referring now to FIGS. 3A–3F, a manufacturing method for the tip 20 is shown and described. In an embodiment of the invention, tip 20 has an outer silicide layer 18 constructed from a reaction between the amorphous silicon tip sub-layer 16 and a metal layer disposed thereover. The metal in layer 18 is chosen to allow this reaction to occur at a sufficiently low temperature that prohibits damaging the chip component 12. Memory devices and other electrical components sometimes contain Aluminum or other metal, which melts at temperatures above about 500 Degrees C., thus requiring lower processing temperatures. For electronic components that utilize higher melting point materials, higher processing temperatures can disrupt dopant defined regions. Accordingly, the metal chosen to react with the tip sub-layer 16 may be platinum or palladium, which has both silicide formation temperatures at or below 500 Degrees C. or other temperatures that may damage or melt metal contained in the chip component. Other exemplary metals that may be used include iron, chrome, nickel, niobium, and molybdenum and other late transition metals.

In FIG. 3A, a substrate such as inner layer 14 is provided and electrically connected to chip component 12 (See FIGS. 1 and 2). As shown in FIG. 3A, an amorphous silicon layer 24 is disposed on inner layer 14. Amorphous silicon is used instead of crystalline silicon, due to its ability to form a silicide with metals at much lower temperatures than either single or poly crystalline silicon. With continued reference to FIG. 3A, a mask layer 26 is disposed on amorphous silicon layer 24. The mask layer 26 may be formed using any suitable known deposition process. As shown in FIG. 3B, the mask layer 26 is then patterned and etched (using known techniques) to form block pattern 28. Depending on the material used as mask layer 26, the type of etching may be wet or dry to form the block pattern 28 as will be readily understood by one skilled in the art. Other removal techniques may also be used besides those described herein.

In FIG. 3C, a wet or dry etched process is then used to remove portions of the amorphous silicon layer 24 to form tip sub-layer 16. As will be understood, any known means of removing portions of amorphous silicon layer 24 to form tip sub-layer 16, including oxidation to exposed portions of amorphous silicon layer 24, or any other known means, may be effectuated to form tip sublayer 16.

Next, as shown in FIG. 3D, a washing or etching process is then used to remove block pattern 28, which results in tip sub-layer 16 protruding from the surface of inner layer 14.

In FIG. 3E, a metal outer layer 18 is then disposed on inner layer 14 and tip sub-layer 16. As discussed above, the metal layer 18 is a metal which forms a silicide with the amorphous silicon (forming tip 16) at a temperature below that which will cause damage to the chip component 12. In an embodiment of the invention, the temperature is at or below 500 Degrees C. and the metal is platinum or palladium. The metal layer may be disposed on inner layer 14 and tip sub-layer 16 by reactive sputter deposition or any other suitable method. According to an embodiment, the entire resulting structure is then annealed at a temperature at or below 500 Degrees C. (or other silicide formation temperature) to form a metal silicide tip 20. In one example where palladium is used as the metal material and the metal outer layer 18 is disposed to a thickness of 1000 Å, the anneal time is less than 20 minutes. In another example, where the metal outer layer 18 is platinum disposed to a thickness of 1000 Å, the anneal time is approximately 2 minutes. In yet a further example, where the metal outer layer 18 is chrome disposed to a thickness of 1000 Å, the anneal time is a number of hours depending upon the forming temperature. As will be understood to one skilled in the art, the length of time, thickness of metal layer 18 and metal material may all be adjusted or changed, and the present invention is not limited to that disclosed in the examples provided herein.

Additionally, as shown in FIG. 3F, a nitride layer 30 may be formed over the tip 20 to enhance resistance to wear. The nitride layer 30 may be applied during or after the annealing process. The nitride is applied during the anneal by incorporating a nitride gaseous material into the environment during the anneal process. As a result, a nitride layer 30 is formed on the surface of tip 20 to enhance the hardness and wear resistance thereof. Reactive sputter deposition is an example of a method that can be used to apply the nitride after silicidation anneal. It should be noted that the above described process may be used while inner layer 14 is attached to chip component 12, if the anneal temperature is below a temperature that will melt metal material within the chip component 12 and cause damage thereto. In an embodiment of the invention, the damaging temperature is at or below 500 Degrees C. However, one skilled in the art will readily recognize that other damaging temperatures may be contemplated depending on the material used to construct the chip component.

While the present invention has been particularly shown and described with reference to the foregoing preferred and alternative embodiments, it should be understood by those skilled in the art that various alternatives to the embodiments of the invention described herein may be employed in practicing the invention without departing from the spirit and scope of the invention as defined in the following claims. It is intended that the following claims define the scope of the invention and that the method and apparatus within the scope of these claims and their equivalents be covered thereby. This description of the invention should be understood to include all novel and non-obvious combinations of elements described herein, and claims may be presented in this or a later application to any novel and non-obvious combination of these elements. The foregoing embodiments are illustrative, and no single feature or element is essential to all possible combinations that may be claimed in this or a later application. Where the claims recite "a" or "a first" element of the equivalent thereof, such claims should be understood to include incorporation of one or more such elements, neither requiring nor excluding two or more such elements.

The invention claimed is:

1. A tip attached to a chip component for making a readable change into a storage medium, the tip comprising:
a conductive layer;
    a tip sub-layer made of amorphous silicon disposed on the conductive layer; and
    an outer layer disposed on the tip sub-layer formed of a silicide material;
    wherein the chip component is constructed with at least one type of metal material;

wherein the silicide includes a metal having a silicide formation temperature below a melting temperature of the metal material of the chip component wherein the melting temperature is at or below 500 Degrees C.

2. The tip according to claim 1, wherein the chip component is an IC electrical component.

3. The memory storage device according to claim 1, further comprising a nitride layer disposed on the outer layer.

4. The tip according to claim 1, wherein the metal of the silicide is Platinum or Palladium.

5. The tip according to claim 1, wherein the metal of the silicide is iron, chrome, nickel, niobium, or molybdenum.

6. A memory storage device comprising
a chip component including a metal material;
a tip connected to the chip;
a storage medium in contact with the tip; wherein the tip comprises: a conductive layer;
a tip sub-layer made of amorphous silicon disposed on the conductive layer; and
an outer layer disposed on the tip sub-layer formed of a silicide;
wherein the silicide includes a metal having a silicide formation temperature below a melting temperature of the metal material of the chip component wherein the formation temperature is at or below 500 Degrees C.

7. The memory storage device according to claim 6, wherein the chip component is an IC electrical component.

8. The memory storage device according to claim 6, further comprising a nitride layer disposed on the outer layer.

9. The memory storage device according to claim 6, wherein the metal of the outer layer is platinum or palladium.

10. The memory storage device according to claim 7, wherein the metal of the outer layer is iron, chrome, nickel, niobium, or molybdenum.

* * * * *

UNITED STATES PATENT AND TRADEMARK OFFICE
CERTIFICATE OF CORRECTION

PATENT NO. : 7,142,449 B2 Page 1 of 1
APPLICATION NO. : 10/759565
DATED : November 28, 2006
INVENTOR(S) : James D. Smith et al.

It is certified that error appears in the above-identified patent and that said Letters Patent is hereby corrected as shown below:

In column 5, line 14, in Claim 6, after "comprising" insert -- : --.

In column 6, line 16, in Claim 10, delete "claim 7" and insert -- claim 6 --, therefor.

Signed and Sealed this

Sixteenth Day of June, 2009

JOHN DOLL
*Acting Director of the United States Patent and Trademark Office*